US010756201B1

(12) United States Patent
Pacheco Peña et al.

(10) Patent No.: US 10,756,201 B1
(45) Date of Patent: Aug. 25, 2020

(54) PROCESS OF MAKING A SHORT-CIRCUITED DIODE THAT PREVENTS ELECTROCUTION

(71) Applicants: John Jairo Pacheco Peña, Bogota (CO); Jorge Luis Jimenez, Municipio Caroni del Estado Bolivar (VE)

(72) Inventors: John Jairo Pacheco Peña, Bogota (CO); Jorge Luis Jimenez, Municipio Caroni del Estado Bolivar (VE)

( * ) Notice: Subject to any disclaimer, the term of this patent is extended or adjusted under 35 U.S.C. 154(b) by 0 days.

(21) Appl. No.: 16/281,082

(22) Filed: Feb. 20, 2019

(51) Int. Cl.
*H01L 29/66* (2006.01)
*H01L 21/326* (2006.01)
*H01L 21/324* (2006.01)
*H01L 21/66* (2006.01)

(52) U.S. Cl.
CPC ........ *H01L 29/6609* (2013.01); *H01L 21/324* (2013.01); *H01L 21/326* (2013.01); *H01L 22/26* (2013.01)

(58) Field of Classification Search
CPC .. G01R 15/125; G01R 31/2632; G01R 31/52; G01R 35/005; H01L 22/14; H01L 29/00; H01L 29/866; H01L 31/107; H01L 2924/12035; H01L 24/00
USPC .......................................................... 438/10
See application file for complete search history.

(56) References Cited

U.S. PATENT DOCUMENTS

| | | | | |
|---|---|---|---|---|
| 4,217,621 A * | 8/1980 | Johnson | ................. | G01R 31/50 361/170 |
| 4,346,347 A * | 8/1982 | Kamata | .............. | G01R 31/2632 324/762.07 |
| 5,578,936 A * | 11/1996 | Gibson | ............. | G01R 31/2632 324/762.07 |
| 7,652,480 B2 * | 1/2010 | Mollet | ................... | H05B 45/50 324/522 |
| 9,160,164 B2 * | 10/2015 | Reschovsky | ............ | H02H 9/00 |
| 9,829,511 B1 * | 11/2017 | Bayarena | ........... | G01R 31/2632 |
| 2015/0153396 A1 * | 6/2015 | Reist | ...................... | G01R 25/00 324/762.07 |

* cited by examiner

*Primary Examiner* — Duy T Nguyen

(74) *Attorney, Agent, or Firm* — Ruben Alcoba, Esq.

(57) ABSTRACT

A process of making a short-circuited diode that changes the properties of an electric current that passes through the short-circuited diode so that the current does not harm a human that contacts the current after it passes through the diode.

1 Claim, 1 Drawing Sheet

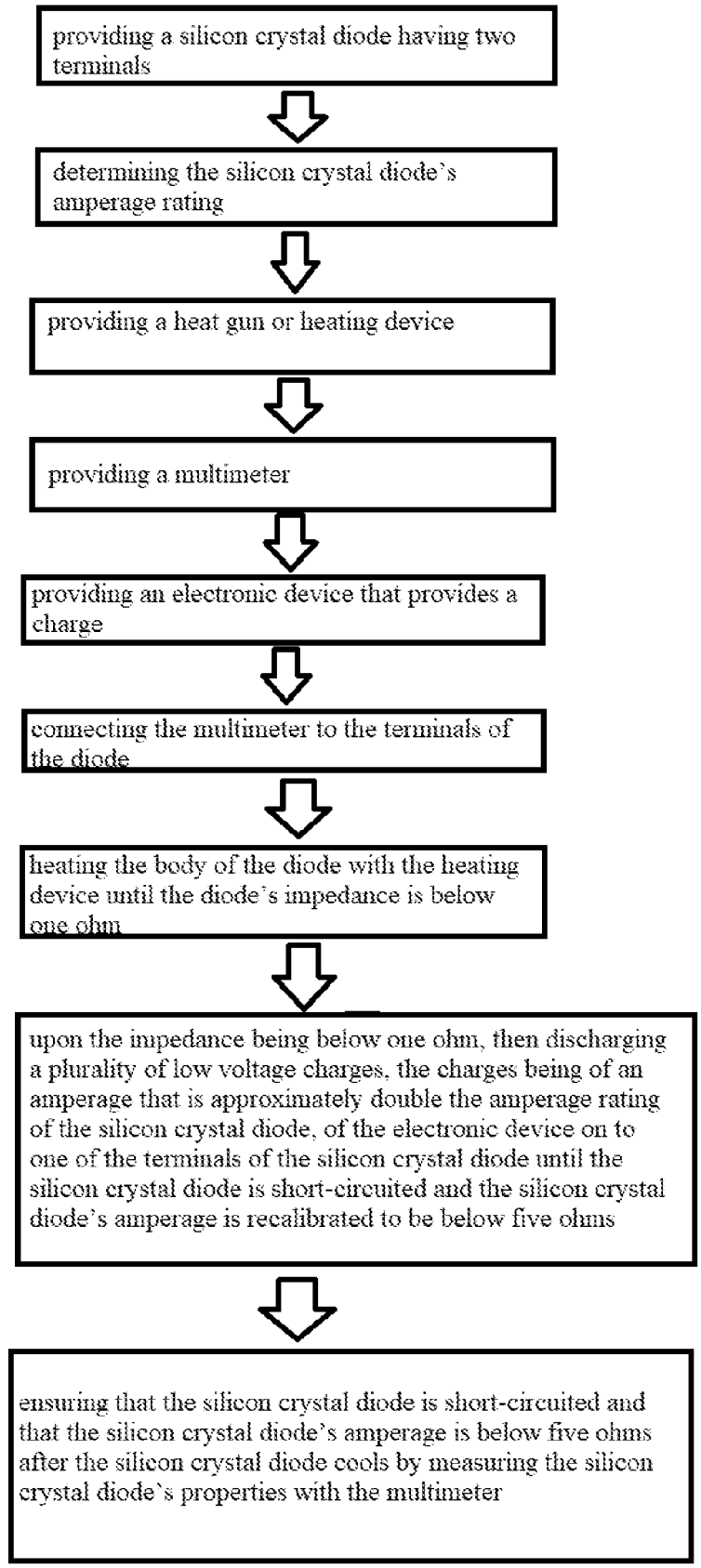

PROCESS OF MAKING A SHORT-CIRCUITED DIODE THAT PREVENTS ELECTROCUTION

BACKGROUND

The present invention is a process of making a short-circuited diode that changes the properties of the electric current that passes through the diode so that the current will not harm a human that contacts the current after it passes through the diode.

The present invention was conceived via divine intervention, for the inventor was not killed while contacting a live wire that was passing 110 volts of alternating current.

In 2011, one of the inventors of the present invention was checking a fault in one of the circuits of a radio. While checking the capacitor of the radio with a multimeter, he accidentally touched the terminals of the multimeter and felt a moderate electric shock. He did not pay much attention to the shock, for he believed that the capacitor was damaged. He continued checking the welds and/or false contacts of the radio and he carelessly shocked himself again. After the second incident, he noticed that the electric shock he received was a moderate one. He checked the voltage of the radio and realized that it was reading 110 volts. To his surprise he was not electrocuted and curiously he started touching other electronic parts of the radio that discharged electricity. Again, to his surprise he only felt moderate shocks while touching the circuits of the radio. After checking the circuits of the radio, he realized that the fault in the radio was a diode and he replaced the diode.

The next day, his curiosity got the best of him and he again tested the connections to the diode with the same voltage. He again tested the diode with the multimeter and the diode shorted. He again touched the terminals and felt a moderate electric shock. He realized that the shorted diode somehow reduced the electric shock he should have received when he touched the live wire carrying the 110 volts of alternating current. His experience with the shorted diode led him to investigate what prevented him from getting electrocuted. He realized that the shorted diode did something to the electric properties of the current that passed through the diode so that current that passed through the diode would not electrocute a person contacting the current.

In 2018, the inventor's son was to present a project in the school that was related to electricity. The project was to build a Tesla coil and the inventor wanted to help his son with the project. His son was afraid to conduct the experiment for he was afraid of getting electrocuted. The inventor told his son not to be afraid to conduct the experiment, for he would ensure that he would not get shocked by the electricity passing through the system by installing his present invention in the system. His son did not trust him.

The inventor then spoke to the second inventor and they both realized that if they could re-produce diodes that were short circuited that they could save lives by preventing people from being electrocuted. After much trial and error, the inventors developed a process of making the present invention. The process created short-circuited diode that appears to change the electric properties of an electric current that passes through the short-circuited diode so that the current does not harm a person contacting the current.

For the foregoing reason there is a need for a process of making a short-circuited diode that will change the properties of an electrical current that passes through the diode so that a person contacting the current will not be electrocuted.

SUMMARY

The present invention describes a process of making a short-circuited diode that changes the properties of an electric current that passes through it so that the current does not harm a human that contacts the current after it passes through the short-circuited diode.

The short-circuited diode is made using a process comprising the steps of first providing a silicon crystal diode having two terminals, determining the silicon crystal diode's amperage rating, providing a heat gun or similar heating device, providing a multimeter, providing an electronic device that will provide a charge and connecting the multimeter to the terminals of the diode. Then heating the body of the diode with the heating device until the diode's impedance is below one ohm. Upon the impedance being below one ohm, then discharging a plurality of low voltage charges, the charges being of an amperage that is approximately double the amperage rating of the silicon crystal diode, of the electronic device on to one of the terminals of the silicon crystal diode until the silicon crystal diode is short-circuited and the silicon crystal diode's amperage is recalibrated to be below five ohms. And lastly, ensuring that the silicon crystal diode is short-circuited and that the silicon crystal diode's amperage is below five ohms after the silicon crystal diode cools by measuring the silicon crystal diode's properties with the multimeter.

An object of the present invention is to provide a short-circuited diode that changes the properties of electricity that passes through it so that is does not electrocute a person contacting the current.

Another object of the present invention is to prevent a person from dying that contacts an electric device that has the short-circuited diode incorporated within the device.

DRAWINGS

These and other features, aspects, and advantages of the present invention will become better understood with regard to the following description, appended claims, and drawings where:

FIG. 1 is a diagram that shows the process of making a short-circuited diode that changes the properties of an electric current that passes through it so that it does not electrocute a person contacting the current.

DESCRIPTION

The present invention is a short-circuited diode that changes the properties of an electric current that passes through it so that it does not electrocute a person contacting the current. The short-circuited diode is prepared by a process comprising the steps of: providing a silicon crystal diode having two terminals; determining the silicon crystal diode's amperage rating; providing a heat gun or similar heating device; providing a multimeter; providing an electronic device that will provide a charge; connecting the multimeter to the terminals of the diode; heating the body of the diode with the heating device until the diode's impedance is below one ohm; upon the impedance being below one ohm, then discharging a plurality of low voltage charges, the charges being of an amperage that is approximately double the amperage rating of the silicon crystal diode, of the electronic device on to one of the terminals of the silicon crystal diode until the silicon crystal diode is short-circuited and the silicon crystal diode's amperage is recalibrated to be below five ohms; and ensuring that the silicon crystal diode is short-circuited and that the silicon crystal diode's amperage is below five ohms after the silicon crystal diode cools by measuring the silicon crystal diode's properties with the multimeter.

The silicon crystal diode is short circuited when current can pass in either direction through the diode.

The short-circuited diode somehow prevents a person contacting an electric current that passes through it from being electrocuted. The inventors cannot determine or define how the electric current's properties change and believe that in time the phenomenon will be determined by the scientific community.

The inventors believe that using the short-circuited diodes of the present invention will conserve energy transmitted through electrical conductors that are downstream from the short-circuited diodes because they theorize that the electrical conductors will not heat to the same level that they would heat if passed through diodes that are not short-circuited.

The inventors also believe that electro-medical devices that use electrical currents to treat infirmities will be developed or improved using the short-circuited diodes of the present invention.

An advantage of the present invention is that it provides a short-circuited diode that changes the properties of electricity (alternating current in the range from 110 to 220 volts) that passes through it so that it will not electrocute a person contacting the current.

Another advantage of the present invention is that it prevents a person from dying contacting an electric device that has the short-circuited diode incorporated within the device.

While the inventor's above description contains many specificities, these should not be construed as limitations on the scope, but rather as an exemplification of several preferred embodiments thereof. Accordingly, the scope should not be determined by the embodiments illustrated, but by the appended claims and their legal equivalents.

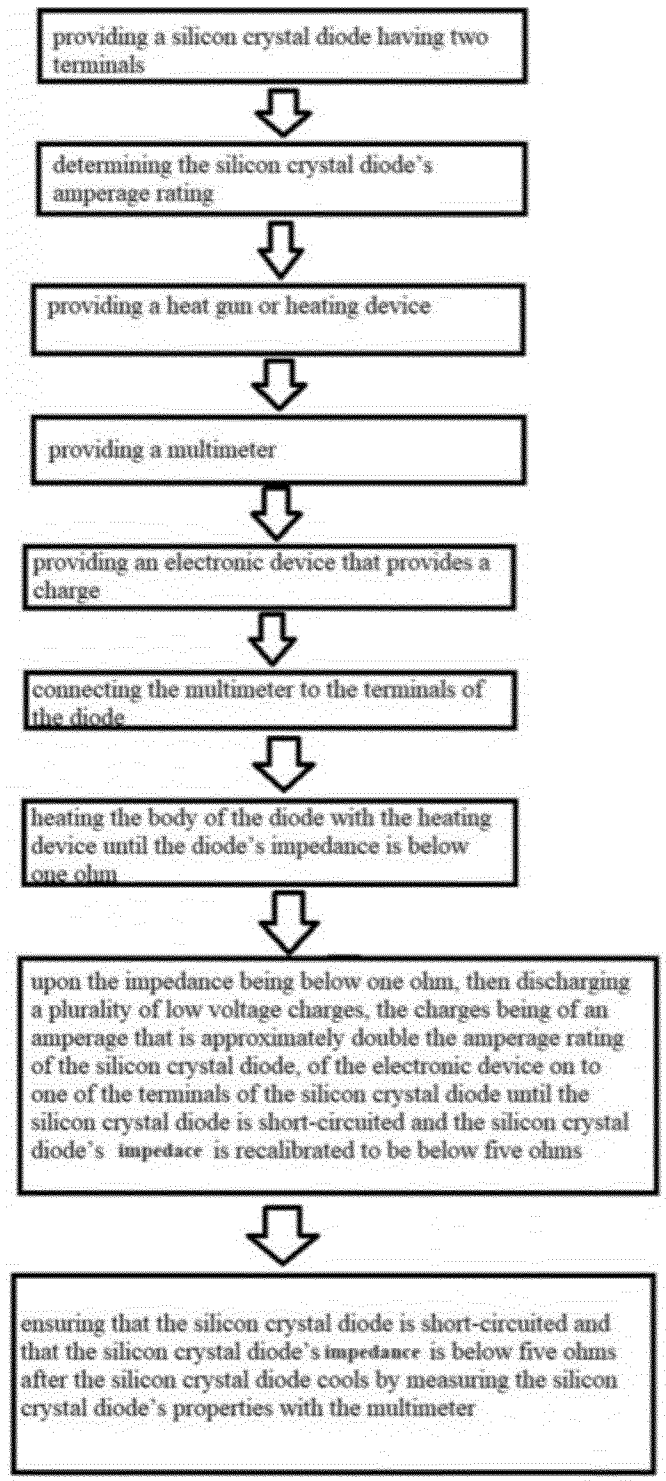

What is claimed is:

1. A short-circuited diode that changes the properties of an electric current that passes through it so that it does not electrocute a person contacting the current is prepared/made by a process comprising the steps of:

providing a silicon crystal diode having two terminals;
    determining the silicon crystal diode's amperage rating;
    providing a heat gun or heating device;
    providing a multimeter;
    providing an electronic device that provides a charge;
    connecting the multimeter to the terminals of the diode;
    heating the body of the diode with the heat gun or the heating device until the diode's impedance is below one ohm;
    upon the impedance being below one ohm, then discharging a plurality of low voltage charges, the charges being of an amperage that is approximately double the amperage rating of the silicon crystal diode, of the electronic device on to one of the terminals of the silicon crystal diode until the silicon crystal diode is short-circuited and the silicon crystal diode's amperage is recalibrated to be below five ohms; and
    ensuring that the silicon crystal diode is short-circuited and that the silicon crystal diode's amperage is below five ohms after the silicon crystal diode cools by measuring the silicon crystal diode's properties with the multimeter.

\* \* \* \* \*

UNITED STATES PATENT AND TRADEMARK OFFICE
CERTIFICATE OF CORRECTION

PATENT NO. : 10,756,201 B1
APPLICATION NO. : 16/281082
DATED : August 25, 2020
INVENTOR(S) : John Jairo Pacheco Peña and Jorge Luis Jimenez It is certified that error appears in the above-identified patent and that said Letters Patent is hereby corrected as shown below:

In the Drawings

Please correct the Drawing Sheet, and on the title page, replace the illustrative print figure, as provided on the attached Replacement Drawing Sheet. On the 8th textbox, numbering from the top to the bottom, Line 7 of the 8th textbox, the word "amperage" is to be changed to the word "impedance". And, On the 9th textbox, numbering from the top to the bottom, Line 2 of the 9th text box, the word "amperage" is to be changed to the word "impedance".

In the Specification

On Column 2, Line 25, the word "amperage" is to be changed to the word "impedance".
On Column 3, Line 2, the word "amperage" is to be changed to the word "impedance".
On Column 3, Line 5, the word "amperage" is to be changed to the word "impedance".
On Column 4, line 27, the word "amperage" is to be changed to the word "impedance".
On Column 4, line 30, the word "amperage" is to be changed to the word "impedance".

Signed and Sealed this
Ninth Day of July, 2024

Katherine Kelly Vidal
*Director of the United States Patent and Trademark Office*